United States Patent
Li et al.

(10) Patent No.: US 7,514,282 B2
(45) Date of Patent: Apr. 7, 2009

(54) PATTERNED SILICON SUBMICRON TUBES

(75) Inventors: Tingkai Li, Vancouver, WA (US);
Jong-Jan Lee, Camas, WA (US);
Jer-Shen Maa, Vancouver, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 217 days.

(21) Appl. No.: 11/649,634

(22) Filed: Jan. 4, 2007

(65) Prior Publication Data
US 2008/0164577 A1    Jul. 10, 2008

(51) Int. Cl.
*H01L 21/00* (2006.01)

(52) U.S. Cl. ............ 438/41; 438/719; 438/723; 438/724; 438/743; 438/744; 438/756; 438/757; 438/FOR. 243; 438/FOR. 244; 977/743

(58) Field of Classification Search ............ 438/41, 438/719, 723, 724, 743, 744, 756, 757, FOR. 243, 438/FOR. 244; 977/743
See application file for complete search history.

(56) References Cited

U.S. PATENT DOCUMENTS

| | | | | |
|---|---|---|---|---|
| 5,705,321 A | * | 1/1998 | Brueck et al. | 430/316 |
| 5,772,905 A | * | 6/1998 | Chou | 216/44 |
| 6,255,038 B1 | * | 7/2001 | Hobbs | 430/316 |
| 2002/0132101 A1 | * | 9/2002 | Fonash et al. | 428/304.4 |
| 2003/0040173 A1 | * | 2/2003 | Fonash et al. | 438/622 |
| 2004/0063100 A1 | * | 4/2004 | Wang | 435/6 |
| 2004/0262636 A1 | * | 12/2004 | Yang et al. | 257/200 |
| 2006/0006463 A1 | * | 1/2006 | Islam et al. | 257/347 |
| 2006/0223211 A1 | * | 10/2006 | Mishra et al. | 438/41 |
| 2006/0284218 A1 | * | 12/2006 | Kaner et al. | 257/288 |

OTHER PUBLICATIONS

P. Kleimann, X. Badel and J. Linnros, Appl. Phys. Lett. 86, 183108 (2005).
L. Schubert, P. Werner, N.D. Zakharov, et al, Appl. Phys. Lett. 84, 4968 (2004).

* cited by examiner

*Primary Examiner*—Thanh V Pham
(74) *Attorney, Agent, or Firm*—Law Office of Gerald Maliszewski; Gerald Maliszewski (57) ABSTRACT

An array of submicron silicon (Si) tubes is provided with a method for patterning submicron Si tubes. The method provides a Si substrate, and forms a silicon dioxide film overlying the Si substrate. An array of silicon dioxide rods is formed from the silicon dioxide film, and $Si_3N_4$ tubes are formed surrounding the silicon dioxide rods. The silicon dioxide rods are etched away. Then, exposed regions of the Si substrate are etched, forming Si tubes underlying the $Si_3N_4$ tubes. Finally, the $Si_3N_4$ tubes are removed.

17 Claims, 6 Drawing Sheets

Fig. 1

Si SUBSTRATE 102

Fig. 2

SiO₂ SUBMICRON RODS
WITH DIAMETERS OF 0.8 μm

Fig. 3

SiO₂ SUBMICRON RODS
WITH DIAMETERS OF 0.5 μm

Fig. 4

SiO2 SUBMICRON RODS
WITH DIAMETERS OF 0.3 μm

Fig. 5

S3N4 HARDMASKS
WITH DIAMETERS OF 0.8 μm

Fig. 6

S3N4 HARDMASKS
WITH DIAMETERS OF 0.5 μm

Fig. 7

S3N4 HARDMASKS
WITH DIAMETERS OF 0.3 μm

Fig. 8

Si SUBMICRON TUBES
WITH DIAMETERS OF 0.8 μm

Fig. 9

Si SUBMICRON TUBES
WITH DIAMETERS OF 0.5 μm

Fig. 10

Si SUBMICRON TUBES
WITH DIAMETERS OF 0.3 µm

Fig. 11

Si SUBMICRON TUBES, BEFORE
OXIDATION AND HF WET ETCHING

Fig. 12

Si SUBMICRON TUBES, AFTER
OXIDATION AND HF WET ETCHING

PATTERNED SILICON SUBMICRON TUBES

BACKGROUND OF THE INVENTION

1. Field of the Invention

This invention generally relates to semiconductor and integrated circuit (IC) fabrication and, more particularly, to a process for fabricating high aspect-ratio submicron silicon (Si) tubes.

2. Description of the Related Art

Si substrates with submicron to nano-scale sized structures are of increasing interest due to their physical properties and their potential for use in new nanodevices. For example, small feature sizes would be useful in nanowire field effect transistors, nano-Si photonics, nano-Si substrates for III-V and SiC light emitting diode (LED) devices, high power, and microelectromechanical system (MEMS) device applications. Comprehensive studies on the vapor-liquid-solid (VLS) growth of whiskers of silicon and other materials, with sizes down to the 100 nanometer (nm) began in the 1960's and 1970's. However, the fabrication of structures with a defined radius, position, length, and therefore, technological application proved to be elusive at that time.

In more recent years, remarkable progress has been achieved. Several growth concepts have been developed for semiconductors, ceramics, and metals, permitting the fabrication of whiskers with diameters of 100 nm and a length of several micrometers. Silicon whiskers are normally grown by chemical vapor deposition (CVD), gas-source molecular-beam epitaxy (GS-MBE), and recently developed electrochemical wet etching processes. CVD and GS-MBE are very expensive processes, however, and it has proven difficult to control the nanowire position, distribution, and orientation. Further, it is difficult to remove the catalyst needed to promote the nanowire growth. The electrochemical wet etching processes requires the use of Si wafers with a very low resistivity (typically <0.01 Ωcm), which limits the process applications.

It would be advantageous if processes existed for fabricating submicron and nano-scale Si structures with controlled features.

It would be advantageous if Si nanotubes could be fabricated using a process to control the nanotube height, diameter, and density.

SUMMARY OF THE INVENTION

The present invention describes a low-cost technique for forming three-dimensional (3D) nanotube structures in silicon, from nanosize to submicrometer scale (50-1000 nm). There is no physical limitation in the application of this same technique to features smaller than 50 nm. An etching process, combining conventional dry and wet etching, and using $SiO_2$ with a spacer $Si_3N_4$ as a hardmask, is used to make the Si submicron tubes. Using these processes it is easy to control the Si nanotube position, distribution, and orientation by lithography and selection of substrate crystallographic orientation. The invention has no special limitations with regard to the resistivity of Si wafers, and is based upon conventional semiconductor processes.

Accordingly, a method is provided for patterning submicron silicon (Si) tubes. The method provides a Si substrate, and forms a silicon dioxide film overlying the Si substrate. An array of silicon dioxide rods is formed from the silicon dioxide film, and $Si_3N_4$ tubes are formed surrounding the silicon dioxide rods. The silicon dioxide rods are etched away. Then, exposed regions of the Si substrate are etched, forming Si tubes underlying the $Si_3N_4$ tubes. Finally, the $Si_3N_4$ tubes are removed.

The array of silicon dioxide rods is created by forming a patterned array of photoresist (PR) islands overlying the silicon dioxide film and etching exposed regions of silicon dioxide. Silicon dioxide rods are formed underlying the PR islands, and the PR islands are removed. More explicitly, the silicon dioxide rods are formed as a result of an oxide dry etching process, and at least one hydrofluoric acid (HF) wet etching process. The Si tubes have a height responsive to the number of HF wet etches and the time duration of the HF wet etches.

The $Si_3N_4$ tubes are formed by conformally depositing a $Si_3N_4$ film overlying the silicon dioxide rods. In response to a silicon nitride spacer etch, $Si_3N_4$ remains overlying the sides of the silicon dioxide rod sides. The Si tubes have a height responsive to the $Si_3N_4$ film thickness. The Si tubes are formed underlying the $Si_3N_4$ tubes by performing first and second plasma etching processes.

Additional details of the above-described method and an array of submicron Si tubes are provided below.

DETAILED DESCRIPTION

Figure 1:
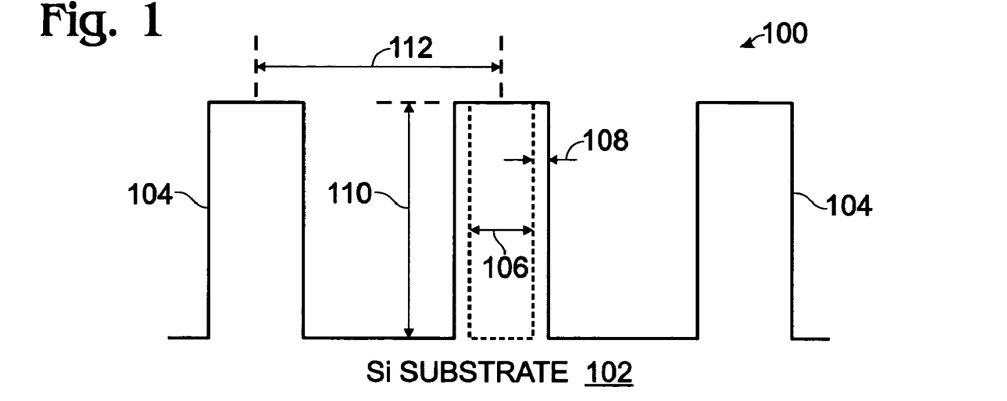
FIG. 1 is a partial cross-sectional view of an array of submicron silicon (Si) tubes.

FIG. 1 is a partial cross-sectional view of an array of submicron silicon (Si) tubes. The array 100 comprises a Si substrate 102. For example, the Si substrate 102 may have a crystallographic orientation of (111) or (100). Si tubes 104 overlie the Si substrate 102. The Si submicron tubes 105 have different orientations dependent upon substrate orientation, with different mechanical properties and chemical sensitivities, which create different applications. For example, the Si tubes grown from Si(111) orientation are better than Si(100) for III-V and SiC growth due to a smaller lattice mismatch. The Si tubes 104 have an inside diameter 106 in a range of about 50 to 800 nanometers (nm), a thickness 108 in a range of about 10 to 300 nm, and a height 110 in a range of about 0.1 to 3 microns. In some aspects, the Si tubes have an aspect ratio of up to about 1:20, where aspect ratio is defined as the ratio of width (2×thickness+inside diameter) to height. That is, the ratio may be in the range of about 1:1 (or less) to 1:20. These limitations in the dimensions represent a typical range. However, it would be possible to form smaller inside diamet and thicknesses by extending the etch durations, or increasing the number of etches. The etching processes are described in detail below. The Si tube height may be varied from the above-mentioned limits by increasing or decreasing deposited film thicknesses.

The density, or distance 112 between tubes, is only dependent upon the limits of the lithographic system used to pattern the photoresist mask, as described below. Typically, adjacent Si tubes 104 are separated by a uniform distance 112 (between tube centers). Again, the uniformity is dependent upon lithographic limits. In other aspects not shown, the Si tubes 104 can be formed with non-uniform distances or in a pattern. Typically, adjacent Si tubes 104 are separated by a distance 112 of greater than about 0.1 microns.

Functional Description

Patterning and etching technologies have been developed using oxide, with spacer silicon nitride as a hardmask, and various dry etching and wet etching processes for making Si substrates with Si submicron tubes. Experimentally, Si submicron tubes with diameters of 200-800 nm, thicknesses of 100-300 nm, and heights of 1-2 microns ($\mu$m) have been obtained. A detailed explanation of the experimental methods and results follow.

The oxide and nitride wet etching process conditions, as well as conditions for dry etching $SiO_2$, $Si_3N_4$, and Si submicron structures are presented in Tables 1 through 6.

TABLE 1

Oxide wet etching

| Materials | Etchant | Ratio |
|---|---|---|
| $SiO_2$ | Buffered oxide etching: $H_2O$/HF etching rates: 2 Å/second $H_2O$/HF | 50:1<br>20:1 |

TABLE 2

Nitride wet etching

| Materials | Etchant | Ratio |
|---|---|---|
| $S_3N_4$ | $H_3PO_4$ At temperature of 170° C. | 100% |

TABLE 3

Recipe 1: Oxide etching conditions

| RF Source Power (W) | RF Bias power (W) | Pressure (mtorr) | C3F8 (sccm) | Ar (sccm) |
|---|---|---|---|---|
| 1800 | 600 | 4 | 18 | 30 |

TABLE 4

Recipe 2: The etching conditions of $S_3N_4$ spacer

| RF Top Power (W) | RF Bottom Power (W) | Pressure (mtorr) | SF6 (sccm) | Etching time (s) |
|---|---|---|---|---|
| 200 | 175 | 10 | 50 | 50-100 |

TABLE 5

Recipe 3: Si submicron tube etching conditions

| RF Top Power (W) | RF Bottom Power (W) | Pressure (mtorr) | Cl2 (sccm) | HBr (sccm) | Etching time (s) |
|---|---|---|---|---|---|
| 250 | 40 | 15 | 40 | 80 | 500 |

TABLE 6

Recipe 4: Si submicron tube etching conditions

| RF Top Power (W) | RF Bottom Power (W) | Pressure (mtorr) | Cl2 (sccm) | O (sccm) | Etching time (s) |
|---|---|---|---|---|---|
| 175 | 1000 | 5 | 100 | 20 | 100 |

Generally, Si submicron tubes are made using the following process steps:

1) The starting materials are Si(111) or Si(100) wafers.

2) A $SiO_2$ layer is formed on the Si wafers using a thermal oxidation or chemical vapor deposition (CVD) process.

3) The silicon dioxide is coated with PR and patterned, based upon the Si submicron tube diameters required.

4) Using the oxide dry etching process of recipe 1 and HF wet etching processes, the oxide submicron rods are made.

5) An HF wet etching oxide is performed, with the PR masking still in place, to further reduce the oxide feature size, especially if there is a minimum size limitation associated with the lithography system.

6) After removing the PR, $S_3N_4$ film is deposited on $SiO_2$ submicron rods. The silicon nitride film thickness deposited is based upon the Si tube thickness required.

7) A silicon nitride spacer etch is performed using the dry etching process of recipe 2.

8) An HF wet etch removes the oxide rod structures and leaves $S_3N_4$ tubes as a hardmask.

9) Further dry etching of the Si is performed using recipes 3 and 4, and nitride as a hardmask, to make Si submicron tubes.

10) The $S_3N_4$ hardmask is removed by hot phosphoric acid etching.

11) Oxidation of Si submicron tubes, followed by an HF etching, can optionally be performed to further reduce the thickness of Si submicron tubes.

EXAMPLE 1

Si(100) with Various Sized Si Submicron Tubes

Figure 2:
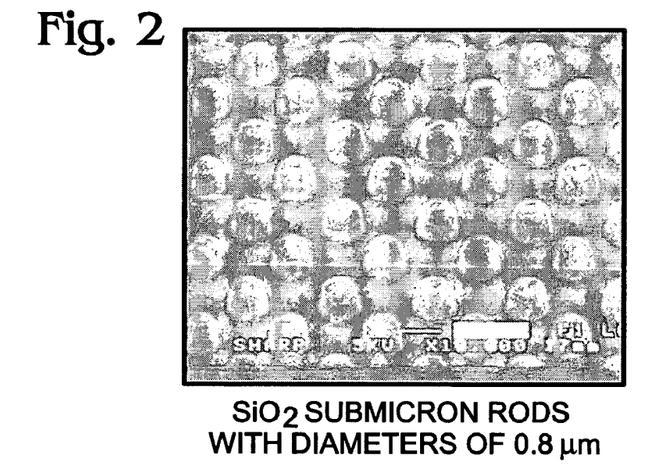
FIGS. 2 through 4 are photographs showing silicon dioxide rods of various diameters.
Figure 3:
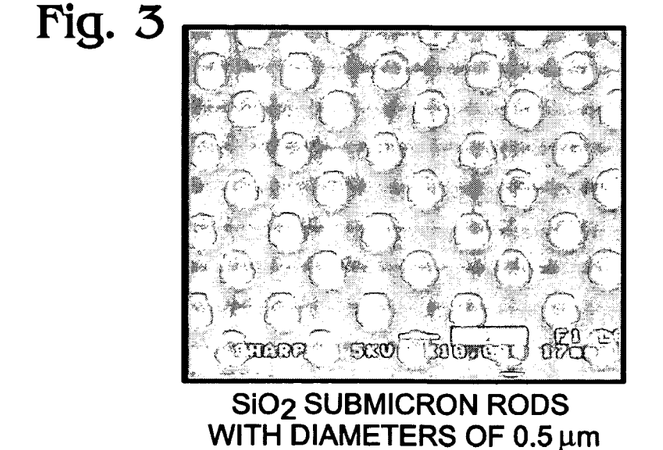
Figure 4:
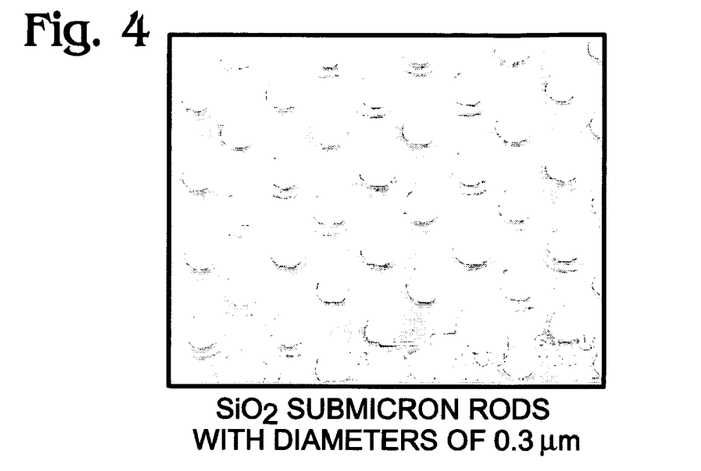

FIGS. 2 through 4 are photographs showing silicon dioxide rods of various diameters. The starting materials are Si(100) wafers. An 800 nm $SiO_2$ layer is formed on the Si wafers using a thermal oxidation process. Then, the $SiO_2$ is coated with PR and patterned in 0.8 $\mu$m (diameter)×1.6 $\mu$m (distance) islands. Using the oxide dry etching process of recipe 1 and HF wet etching processes, the oxide submicron rods can be made, as shown in FIG. 2. As shown, the $SiO_2$ submicron tubes have the dimensions of: 0.8 $\mu$m (diameter)×0.8 $\mu$m (height)×1.6 $\mu$m (distance). The diameters of $SiO_2$ submicron rods may be further reduced using HF with 50:1 (HF:$H_2O$) wet etching, as shown in FIGS. 3 and 4. Note: the PR is still in place over the rods. SiO$_2$ submicron tubes are obtained with the following dimensions: 0.3-0.5 μm (diameter)×0.8 μm (height)×1.6 μm (distance).

Figure 5:
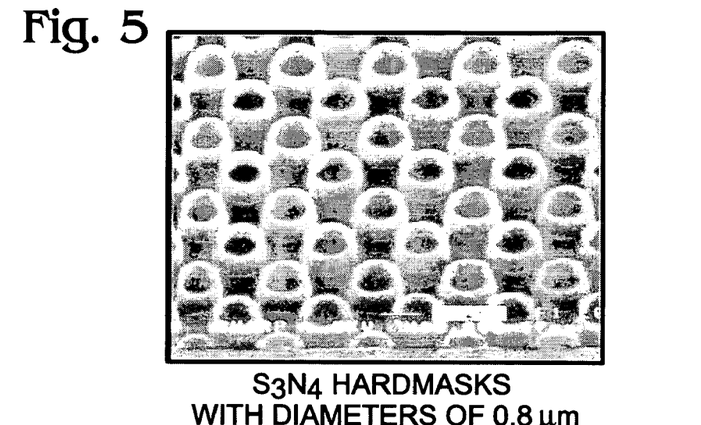
FIGS. 5 through 7 are photographs of silicon nitride hardmask tubes of various dimensions.
Figure 6:
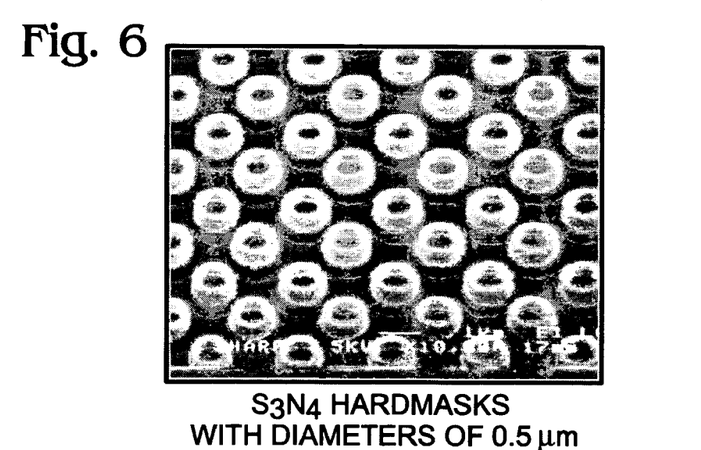
Figure 7:
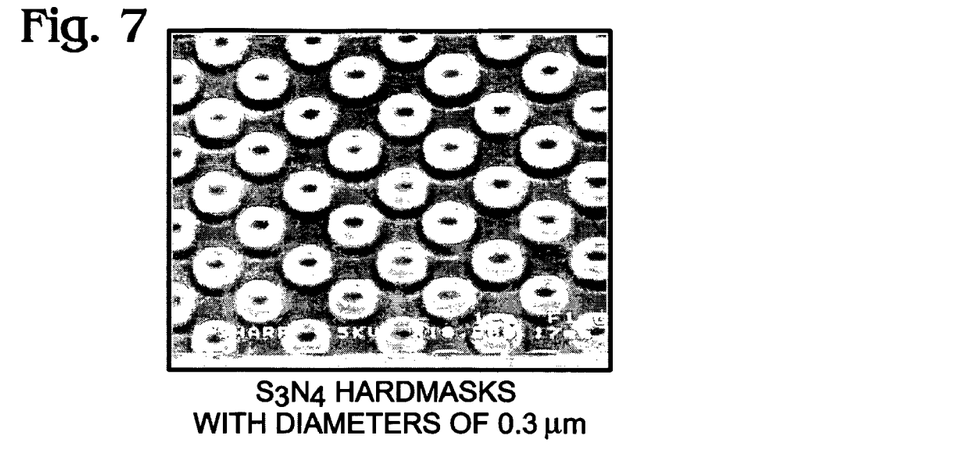

FIGS. 5 through 7 are photographs of silicon nitride hardmask tubes of various dimensions. After removing the PR, a 300 nm thick S$_3$N$_4$ film is deposited on the SiO$_2$ submicron rods by CVD processes. The silicon nitride spacer hardmasks are made by a dry etching process using recipe 2. Then, HF wet etching is used to remove the oxide, and leaving S$_3$N$_4$ tubes as a hardmask. The hardmask of FIG. 5 results from the silicon dioxide rods of FIG. 2. Likewise, FIG. 6 is associated with FIG. 3, and FIG. 7 is associated with FIG. 4. The figures depict the various sizes of S$_3$N$_4$ hardmask. Finally, the various Si submicron tubes are made by further dry etching of the Si using recipes 3 and 4, and nitride as a hardmask.

Figure 8:
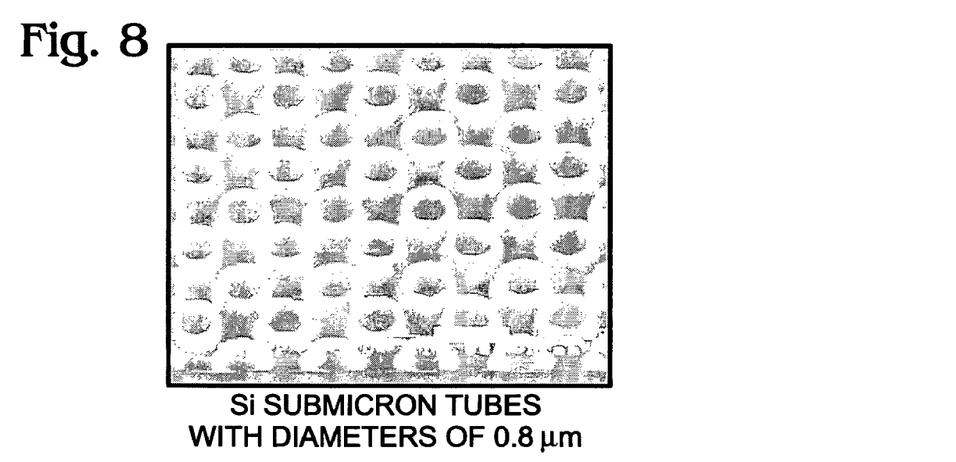
FIGS. 8 through 10 are photographs of silicon tubes of various dimensions.
Figure 9:
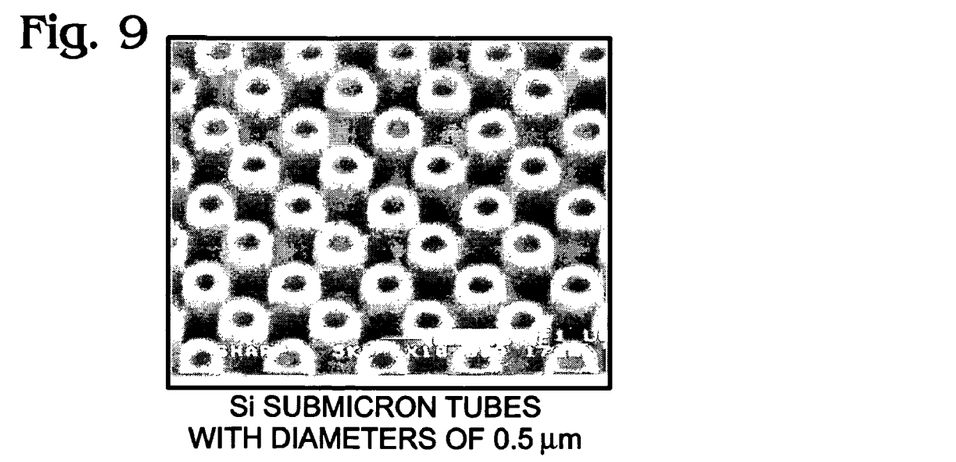
Figure 10:
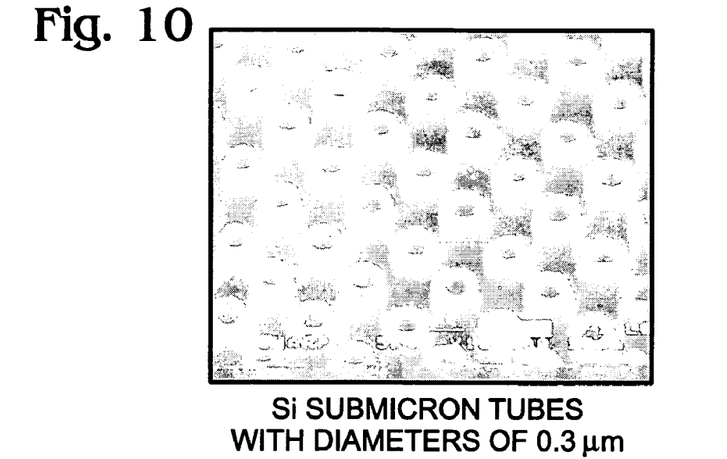

FIGS. 8 through 10 are photographs of silicon tubes of various dimensions. After removing the S$_3$N$_4$ hardmasks by hot phosphoric acid etching, the Si submicron tubes can be seen. Si submicron tubes with the following dimensions are obtained: 300-800 nm (diameter)×300 nm (thickness)×1-2 μm (height).

EXAMPLE 2

Si(100) with Various Thickness Submicron Tubes

Figure 11:
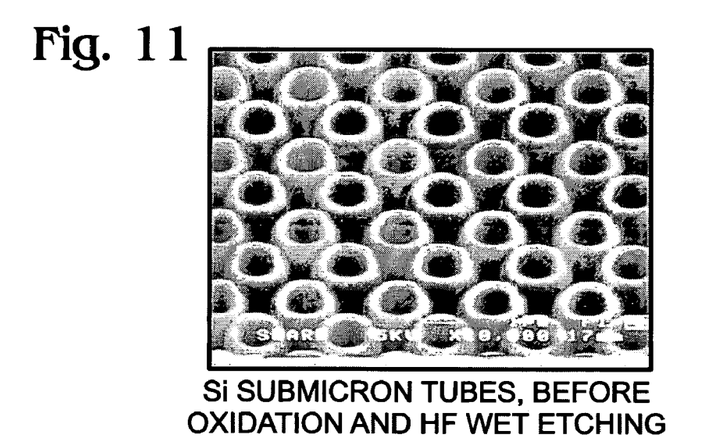
FIGS. 11 and 12 are a comparison of Si submicron tubes following additional processes to reduce tube thickness.
Figure 12:
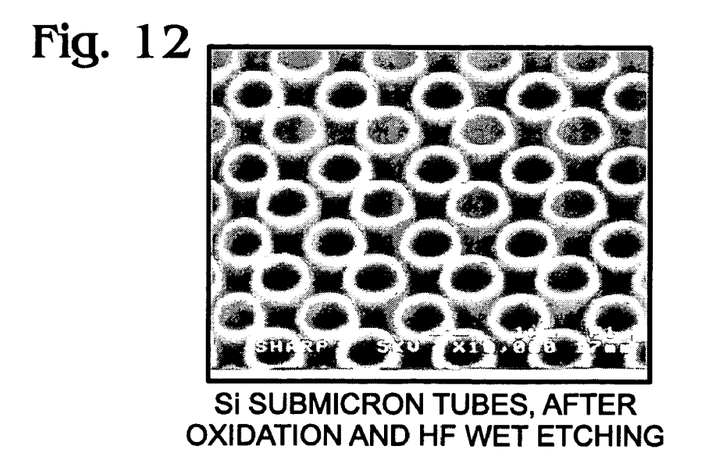

FIGS. 11 and 12 are a comparison of Si submicron tubes following additional processes to reduce tube thickness. Using the same techniques are described in Example 1, above, the Si submicron tube thicknesses can be varied by controlling the silicon nitride hardmask thickness or with the further steps of oxidizing the Si submicron tubes and HF wet etching. FIG. 11 depicts the original thickness of Si submicron tubes using Example 1 techniques, which shows a Si submicron tube thickness of 0.3 μm. FIG. 12 depicts the Si submicron tubes following an oxidation of 100 nm, and an HF wet etching process. The thickness of Si submicron tubes is reduced to 0.15 μm.

EXAMPLE 3

Si(111) with Si Submicron Tubes

The starting materials are Si(111) wafers. A 500 nm SiO$_2$ layer is formed on the Si wafers using a thermal oxidation process. Then, photoresist is coated and patterned in islands as follows: 0.8 μm (diameter)×1.6 μm (distance). Using the oxide dry etching process of recipe 1 and HF wet etching processes, SiO$_2$ submicron rods with the following dimensions are formed: 0.8 μm (diameter)×0.5 μm (height)×1.6 μm (distance). The diameters of SiO$_2$ submicron rods are reduced by HF with 50:1 (HF:H$_2$O) wet etching for 10 minutes (still covered with photoresist). The SiO$_2$ submicron rods have the following dimensions: 0.6 μm (diameter)×0.5 μm (height)×1.6 μm (distance).

After removing the PR, a 200 nm thick S$_3$N$_4$ film is deposited on the SiO$_2$ submicron rods by CVD processes. Silicon nitride spacer hardmasks are made using the dry etching process of recipe 2. Then, an HF wet etching is used to remove oxide and leave S$_3$N$_4$ tubes as a hardmask. Finally, Si submicron tubes are made by further dry etching the Si using recipe 3 and 4, using the nitride as a hardmask.

Figure 13:
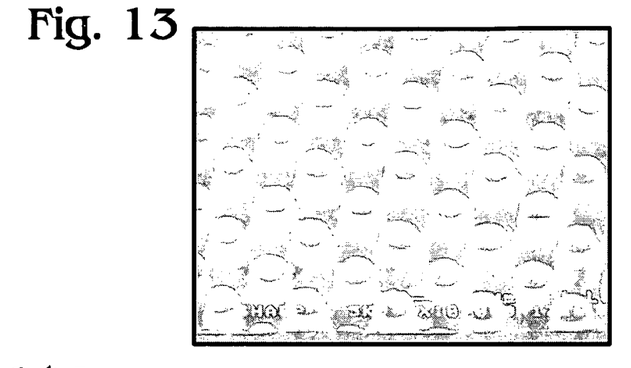
FIG. 13 is a photograph depicting Si submicron tubes formed using the processes of Example 3.

FIG. 13 is a photograph depicting Si submicron tubes formed using the processes of Example 3. After removing the S$_3$N$_4$ hardmask by hot phosphoric acid etching, the Si submicron tubes can be seen. The Si submicron tubes have the following dimensions: 600 nm (diameter)×150 nm (thickness)×1-2 μm (height).

Thus, patterning and etching technologies have been developed using oxide with a spacer silicon nitride hardmask, and dry etching and wet etching processes, for making Si substrates with Si submicron tubes. Si submicron tubes with the following dimensions have been obtained experimentally: 200-800 nm (diameter)×100-300 nm (thickness)×1-2 μm (height). Using these processes it is easy to control the submicron tube position distribution and orientation by lithography, and selection of substrate orientation. The processes do not rely upon the resistivity of Si wafers, or upon non-conventional semiconductor processes. Advantageously, the process it able to create Si tubes that have both a small inside diameter and a large height. Further, these high aspect ratio Si tubes can be formed in high density arrays. The minimum distance between tubes necessarily depends upon the tube size. In fact, the minimum distance between tubes is the (inside) diameter of tube plus the tube thickness. While the minimum tube size, based upon current lithographic limits, is about 0.1 μm, new photograph equipment has already been reported with resolutions down 35 nm. Using this technology, the above-described tube features can be reduced by approximately 67%.

Figure 14A:
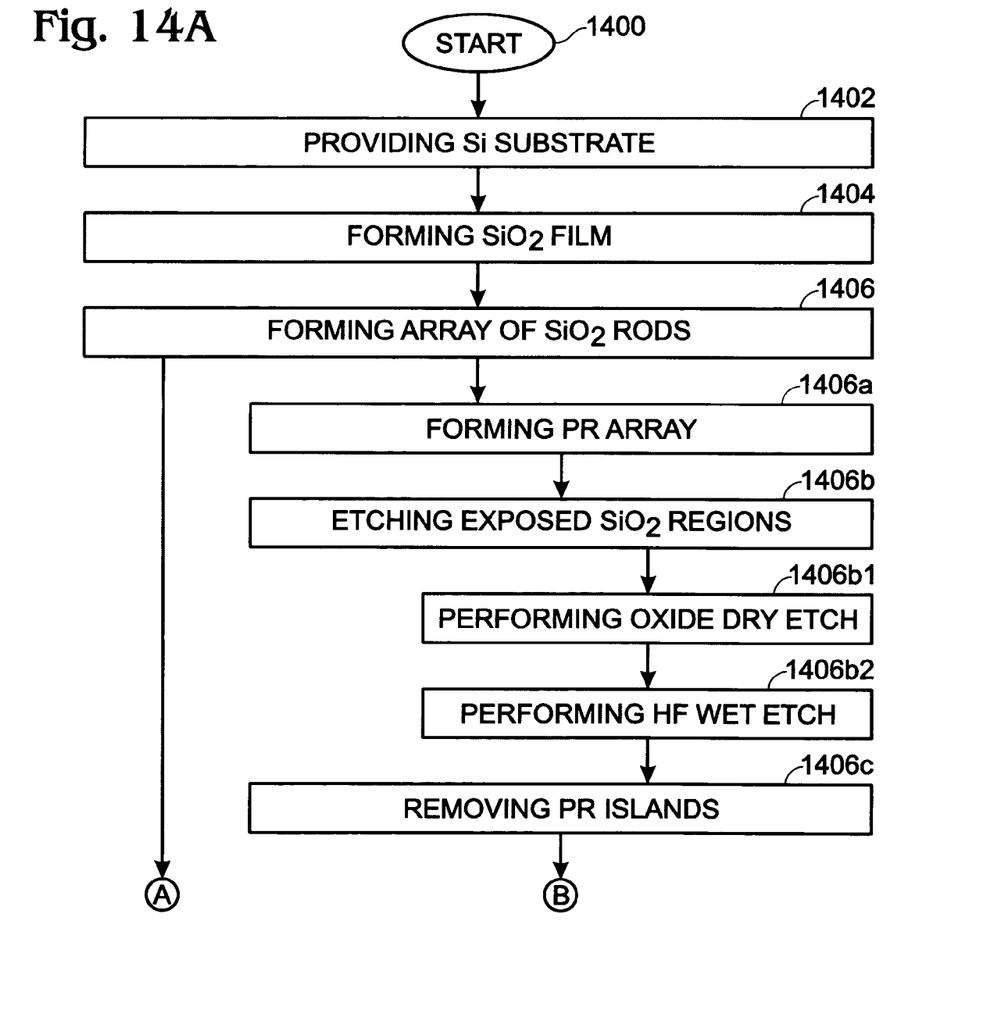
FIGS. 14A and 14B are flowcharts illustrating a method for patterning submicron Si tubes.
Figure 14B:
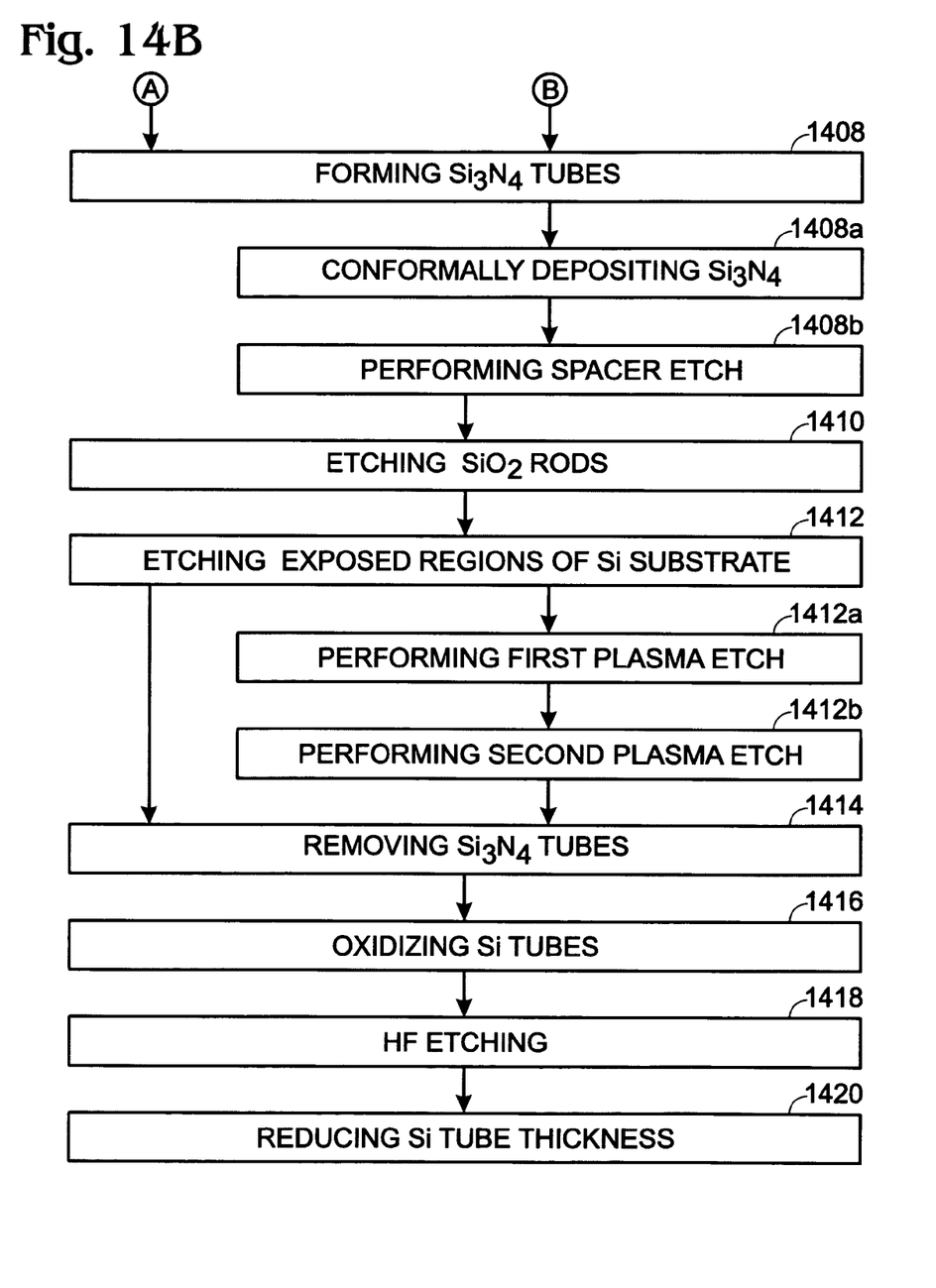

FIGS. 14A and 14B are flowcharts illustrating a method for patterning submicron Si tubes. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 provides a Si substrate. For example, Si substrates having either (100) or (111) crystallographic orientations may be used. Step 1404 forms a silicon dioxide film overlying the Si substrate. Step 1406 forms an array of silicon dioxide rods. Step 1408 forms Si$_3$N$_4$ tubes surrounding the silicon dioxide rods. Step 1410 etches the silicon dioxide rods. Step 1412 etches exposed regions of the Si substrate, forming Si tubes underlying the Si$_3$N$_4$ tubes. Step 1414 removes the Si$_3$N$_4$ tubes, using a hot phosphoric acid etch for example. In one aspect subsequent to removing the Si$_3$N$_4$ tubes, Step 1416 optionally oxidizes the Si tubes. Step 1418 HF etches the Si tubes, and in response to the HF etching, Step 1420 reduces Si tube thickness.

In one aspect, forming the array of silicon dioxide rods in Step 1406 includes substeps. Step 1406a forms a patterned array of photoresist (PR) islands overlying the silicon dioxide film. Step 1406b etches exposed regions of silicon dioxide, forming silicon dioxide rods underlying the PR islands. Step 1406c removes the PR islands.

Further, etching exposed regions of silicon dioxide in Step 1406b may include additional substeps. Step 1406b1 performs an oxide dry etching process. Subsequent to the oxide dry etching, Step 1406b2 performs at least one HF wet etching process. Then, forming Si tubes in Step 1412 includes forming Si tubes having a height responsive to the number of HF wet etches and the time duration of the HF wet etches. Note: the etching of Step 1406b may leave a thin layer of silicon dioxide overlying the Si substrate. Alternately, the etching may be configured to completely remove silicon dioxide overlying the Si substrate surface between tubes, and etch into the Si substrate.

In one aspect, the oxide dry etching of Step 1406b1 is performed using an ion etching process as follows:

supplying a top electrode radio frequency (RF) source power in the range of about 1000 to 2500 watts (W);

supplying a bottom electrode RF bias power in a range of about 400 to 800 W;

creating a pressure in a range of about 3 to 8 millitorr (mtorr)

supplying $C_3F_8$ gas in a range of about 10 to 20 standard cubic centimeters (SCCM); and, supplying Ar in a range of about 20 to 40 SCCM.

In a different aspect of the method, forming $Si_3N_4$ tubes in Step 1408 includes substeps. Step 1408a conformally deposits a $Si_3N_4$ film overlying the silicon dioxide rods. Step 1408b performs a silicon nitride spacer etch. In response to the silicon nitride spacer etch, Step 1408c leaves $Si_3N_4$ overlying silicon dioxide rod sides. Then, forming Si tubes in Step 1412 includes forming Si tubes having a height responsive to the $Si_3N_4$ film thickness.

For example, the silicon nitride spacer etch of Step 1408b may be performed using a reactive ion etching (REI) as follows:

supplying a top electrode RF power in a range of about 150 to 250 W;

supplying a bottom electrode RF power in a range of about 150 to 200 W;

creating a pressure in a range of about 2 to 6 mtorr;

supplying $SF_6$ gas in a range of about 25 to 75 SCCM; and, etching for a time duration in a range of about 50 to 100 seconds.

In another aspect, forming Si tubes underlying the $Si_3N_4$ tubes in Step 1412 includes substeps. Step 1412a performs a first plasma etching process, and subsequent to the first plasma etching process, Step 1412b performs a second plasma etching process.

For example, the first plasma etching process of Step 1412a may be performed as follows:

supplying a top electrode RF power in a range of about 200 to 300 W;

supplying a bottom electrode RF power in a range of about 20 to 60 W;

creating a pressure of about 10 to 20 mtorr;

supplying $Cl_2$ gas in a range of about 30 to 50 SCCM;

supplying HBr gas in a range of about 60 to 100 SCCM;

etching for a time duration of about 500 seconds; and, forming Si tubes having a height responsive to the first plasma etching time duration.

The second plasma etching process of Step 1412b may be performed as follows:

supplying a top electrode RF power in a range of about 150 to 200 W;

supplying a bottom electrode RF power in a range of about 800 to 1200 W;

creating a pressure in a range of about 6 to 10 mtorr;

supplying $Cl_2$ gas in a range of about 80 to 120 SCCM;

supplying oxygen in a range of about 10 to 30 SCCM;

etching for a time duration of about 100 seconds; and, forming Si tubes having a height responsive to the second plasma etching time duration.

In one aspect, forming the silicon dioxide film in Step 1414 includes thermally oxidizing the Si substrate and forming a silicon dioxide film having a thickness of greater than about 50 nm. The Si tubes formed in Step 1412 have a height responsive to the silicon dioxide thickness. In another aspect, the silicon dioxide rods formed in Step 1406 have a diameter in a range of about 0.05 to 0.8 microns and a height greater than about 0.05 microns. Adjacent silicon dioxide rods may have centers separated by a distance greater than, or equal to the lithographic limits of a system used for forming the array of PR islands.

In one aspect, the $Si_3N_4$ tubes formed in Step 1408 have an inside diameter in a range of about 0.05 to 0.8 microns and a height greater than about 0.2 microns. The Si tubes formed in Step 1412 may have an inside diameter in a range of about 50 to 800 nanometers, a thickness in a range of about 10 to 300 nm, and a height in a range of about 0.1 to 3 microns. In another aspect, the Si tubes have an aspect ratio of up to about 1:20.

An array of high aspect-ratio Si submicron tubes has been presented, along with an associated fabrication process. Examples of specific processes and materials have been given to illustrate the invention. However, the invention is not limited to merely these examples. Likewise, the invention is not necessarily limited to tubes made of only Si, to only tube shapes, to only silicon nitride hardmasks, or to the explicitly-named etchants, as equivalents may be known in the art. Other variations and embodiments of the invention will occur to those skilled in the art.

We claim:

1. A method for patterning submicron silicon (Si) tubes, the method comprising:

providing a Si substrate;

forming a silicon dioxide film overlying the Si substrate;

forming an array of silicon dioxide rods;

forming $Si_3N_4$ tubes surrounding the silicon dioxide rods;

etching the silicon dioxide rods;

etching exposed regions of the Si substrate, forming Si tubes underlying the $Si_3N_4$ tubes; and, removing the $Si_3N_4$ tubes.

2. The method of claim 1 wherein forming the array of silicon dioxide rods includes:

forming a patterned array of photoresist (PR) islands overlying the silicon dioxide film;

etching exposed regions of silicon dioxide, forming silicon dioxide rods underlying the PR islands; and, removing the PR islands.

3. The method of claim 2 wherein etching exposed regions of silicon dioxide, forming silicon dioxide rods underlying the PR islands, includes:

performing an oxide dry etching process; and, subsequent to the oxide dry etching, performing at least one HF wet etching process; and, wherein forming Si tubes includes forming Si tubes having a height responsive to a factor selected from a group consisting of the number of HF wet etches and the time duration of the HF wet etches.

4. The method of claim 3 wherein performing the oxide dry etching process includes performing an ion etching process as follows:

supplying a top electrode radio frequency (RF) source power in the range of about 1000 to 2500 watts (W);

supplying a bottom electrode RF bias power in a range of about 400 to 800 W;

creating a pressure in a range of about 3 to 8 millitorr (mtorr)

supplying $C_3F_8$ gas in a range of about 10 to 20 standard cubic centimeters (SCCM); and, supplying Ar in a range of about 20 to 40 SCCM.

5. The method of claim 1 wherein forming $Si_3N_4$ tubes includes:

conformally depositing a $Si_3N_4$ film overlying the silicon dioxide rods;

performing a silicon nitride spacer etch; and, in response to the silicon nitride spacer etch, leaving $Si_3N_4$ overlying silicon dioxide rod sides; and, wherein forming Si tubes includes forming Si tubes having a height responsive to the $Si_3N_4$ film thickness.

6. The method of claim 5 wherein performing the silicon nitride spacer etch includes performing a reactive ion etching (REI) as follows:
supplying a top electrode RF power in a range of about 150 to 250 W;
supplying a bottom electrode RF power in a range of about 150 to 200 W;
creating a pressure in a range of about 2 to 6 mtorr;
supplying $SF_6$ gas in a range of about 25 to 75 SCCM; and,
etching for a time duration in a range of about 50 to 100 seconds.

7. The method of claim 1 wherein forming Si tubes underlying the $Si_3N_4$ tubes includes:
performing a first plasma etching process; and,
subsequent to the first plasma etching process, performing a second plasma etching process.

8. The method of claim 7 wherein performing the first plasma etching process includes:
supplying a top electrode RF power in a range of about 200 to 300 W;
supplying a bottom electrode RF power in a range of about 20 to 60 W;
creating a pressure of about 10 to 20 mtorr;
supplying $Cl_2$ gas in a range of about 30 to 50 SCCM;
supplying HBr gas in a range of about 60 to 100 SCCM;
etching for a time duration of about 500 seconds; and,
forming Si tubes having a height responsive to the first plasma etching time duration.

9. The method of claim 7 wherein performing the second plasma etching process includes:
supplying a top electrode RF power in a range of about 150 to 200 W;
supplying a bottom electrode RF power in a range of about 800 to 1200 W;
creating a pressure in a range of about 6 to 10 mtorr;
supplying $Cl_2$ gas in a range of about 80 to 120 SCCM;
supplying oxygen in a range of about 10 to 30 SCCM;
etching for a time duration of about 100 seconds; and,
forming Si tubes having a height responsive to the second plasma etching time duration.

10. The method of claim 1 wherein removing the $Si_3N_4$ tubes includes removing the $Si_3N_4$ tubes using a hot phosphoric acid etching.

11. The method of claim 1 wherein forming Si tubes includes forming Si tubes having an inside diameter in a range of about 50 to 800 nanometers (nm), a thickness in a range of about 10 to 300 nm, and a height in a range of about 0.1 to 3 microns.

12. The method of claim 11 wherein forming the Si tubes includes forming Si tubes having an aspect ratio of up to about 1:20.

13. The method of claim 2 wherein forming the array of silicon dioxide rods includes forming silicon dioxide rods having a diameter in a range of about 0.05 to 0.8 microns and a height greater than about 0.05 microns.

14. The method of claim 13 wherein forming the array of silicon rods includes forming adjacent silicon dioxide rods with centers separated by a distance greater than, or equal to the lithographic limits of a system used for forming the array of PR islands.

15. The method of claim 1 wherein forming the $Si_3N_4$ tubes includes forming $Si_3N_4$ tubes having an inside diameter in a range of about 0.05 to 0.8 microns and a height greater than about 0.2 microns.

16. The method of claim 1 wherein forming the silicon dioxide film includes thermally oxidizing the Si substrate and forming a silicon dioxide film having a thickness of greater than about 50 nm; and,
wherein forming Si tubes includes forming Si tubes having a height responsive to the silicon dioxide thickness.

17. The method of claim 1 further comprising:
subsequent to removing the $Si_3N_4$ tubes, oxidizing the Si tubes;
HF etching the Si tubes; and,
in response to the HF etching, reducing Si tube thickness.

* * * * *